(12) United States Patent  (10) Patent No.: US 7,491,580 B2
Matsushima et al.  (45) Date of Patent: Feb. 17, 2009

(54) METHOD OF MANUFACTURING ELECTRO-OPTICAL DEVICE

(75) Inventors: Seiichi Matsushima, Fujimi-cho (JP); Kenji Murakami, Fujimi-cho (JP); Hiroki Maruyama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 474 days.

(21) Appl. No.: 11/131,235

(22) Filed: May 18, 2005

(65) Prior Publication Data

US 2005/0266596 A1 Dec. 1, 2005

(30) Foreign Application Priority Data

May 25, 2004 (JP) ............... 2004-154635
Sep. 29, 2004 (JP) ............... 2004-283612

(51) Int. Cl.
*H01L 21/461* (2006.01)

(52) U.S. Cl. ............ 438/107; 438/33; 438/110; 438/118; 438/458; 438/460; 257/777; 257/E27.137; 257/E27.144; 257/E27.161

(58) Field of Classification Search ............ 438/116, 438/455, 26, 33, 108–109, 113, 118, 458, 438/460; 257/704, E23.009, E23.192, 686, 257/777, 778, E27.137, E23.039, E23.169–E23.178, 257/E27.144, E27.161; 349/58, 84, 187–191
See application file for complete search history.

(56) References Cited

U.S. PATENT DOCUMENTS

| | | | |
|---|---|---|---|
| 5,358,590 A * | 10/1994 | Yamanaka | ............... 156/247 |
| 5,835,179 A | 11/1998 | Yamanaka | |
| 6,270,611 B1 * | 8/2001 | Ohki et al. | ............... 156/220 |
| 6,373,616 B1 | 4/2002 | Ogawa et al. | |
| 6,476,415 B1 * | 11/2002 | Walker et al. | ............... 257/59 |
| 6,603,590 B2 | 8/2003 | Ogawa et al. | |
| 6,654,083 B1 | 11/2003 | Toda et al. | |
| 6,731,367 B1 | 5/2004 | Saitoh | |
| 6,995,468 B2 * | 2/2006 | Abe et al. | ............... 257/724 |
| 7,068,343 B2 | 6/2006 | Saitoh | |
| 2004/0023438 A1 * | 2/2004 | Egawa et al. | ............... 438/113 |
| 2004/0080029 A1 * | 4/2004 | Chow et al. | ............... 257/676 |
| 2005/0189658 A1 * | 9/2005 | Xiaochun et al. | ............... 257/782 |

FOREIGN PATENT DOCUMENTS

| | | |
|---|---|---|
| JP | A-06-148622 | 5/1994 |
| JP | A-06-194637 | 7/1994 |
| JP | A-08-201747 | 8/1996 |
| JP | A-10-90692 | 4/1998 |
| JP | A-10-123964 | 5/1998 |
| JP | A-11-295683 | 10/1999 |
| JP | A-2000-119029 | 4/2000 |

(Continued)

*Primary Examiner*—Zandra Smith
*Assistant Examiner*—M. M.
(74) *Attorney, Agent, or Firm*—Oliff & Berridge, PLC

(57) ABSTRACT

There is provided a method of manufacturing an electro-optical device from a large substrate that is cut into a plurality of first substrates having a chip shape. In the electro-optical device, second substrates of a chip shape are bonded to the first substrates. The method includes adhering a large glass substrate to approximately an entire surface of the large substrate opposite to a surface to which the second substrates are bonded; and cutting both the large substrate and the large glass substrate into first substrate units.

15 Claims, 7 Drawing Sheets

FOREIGN PATENT DOCUMENTS

| | | |
|---|---|---|
| JP | A-2000-193923 | 7/2000 |
| JP | A-2000-193943 | 7/2000 |
| JP | A-2000-227768 | 8/2000 |
| JP | 2001066575 * | 3/2001 |
| JP | A-2002-072176 | 3/2002 |
| JP | A 2002-365649 | 12/2002 |
| JP | A-2003-058065 | 2/2003 |
| JP | A-2003-140125 | 5/2003 |
| JP | A-2003-337550 | 11/2003 |
| JP | A-2004-21056 | 1/2004 |
| JP | A-2004-070163 | 3/2004 |
| JP | A-2004-117580 | 4/2004 |
| JP | A-2004-144940 | 5/2004 |
| JP | A-2005-249886 | 9/2005 |

* cited by examiner

FIG. 6

| | TOP HEATING HEAD TEMPERATURE | BOTTOM HOT PLATE TEMPERATURE | PRESSURE BONDING TIME | IS ADHESIVE CURED? |
|---|---|---|---|---|
| CONDITION 1 | 85°C | 70°C | 20s | × |
| CONDITION 2 | 90°C | 70°C | 20s | × |
| CONDITION 3 | 95°C | 70°C | 20s | × |
| CONDITION 4 | 100°C | 70°C | 20s | × |
| CONDITION 5 | 100°C | 80°C | 20s | ○ |
| CONDITION 6 | 100°C | 80°C | 10s | ○ |

METHOD OF MANUFACTURING ELECTRO-OPTICAL DEVICE

BACKGROUND OF THE INVENTION

1. Technical Field

The present invention relates to a method of manufacturing electro-optical devices in which glass substrates are disposed on external surfaces of a display device.

2. Related Art

In a projection type liquid crystal display device, as one example of an electro-optical device, if dust is adhered on or close to a surface of a liquid crystal panel, the dust is expanded by a projector lens, etc. and is then projected onto a screen, which significantly reduces the display quality. In order to prevent this, for example, as disclosed in Japanese Unexamined Patent Application Publication No. 2003-140125, technologies in which a glass substrate having a dust-proof function is attached to the external surface of the liquid crystal panel have been widely used.

By protecting the external surface of the liquid crystal panel using the glass substrate, dust and the like can be prevented from being adhered on the liquid crystal panel. Further, even if dust, etc. is adhered on the external surface of the glass substrate, the distance between the dust and the liquid crystal becomes wider due to the glass substrate thickness. An image of the dust is thus defocused, and is strongly blurred when displayed on the screen. Therefore, the image of the dust becomes less obvious.

Although the surface of the liquid crystal panel is protected by the glass substrate, it is possible for dust or the like to adhere to a surface of the liquid crystal panel or an inner surface of the glass substrate in the manufacturing process.

The glass substrate is typically adhered to an external surface of a completed liquid crystal panel by means of a heat-curing-type adhesive, and so on. In order to cure the adhesive, a time ranging form about several tens of minutes to one hour is needed. There is, however, a possibility that dust, etc. may enter between the liquid crystal panel and the glass substrate during this process.

Due to this, when the glass substrate is adhered to the liquid crystal panel, it is adhered on one side of the liquid crystal panel by using a heat-curing-type adhesive, and is then fixed by a jig frame in a state in which the glass substrate is positioned at a predetermined location. This prevents dust from entering between the liquid crystal panel and the glass substrate before the heat-curing-type adhesive is cured. Japanese Unexamined Patent Application Publication No. 2004-21056 is an example of related art.

When the glass substrate is adhered, the liquid crystal panel and the glass substrate must be fixed to the jig frame one-by-one. Furthermore, as this has to be individually performed on both sides of the liquid crystal panel, installation and removal of the jig frame become troublesome, and adhesion takes twice as long compared to the curing time of the heat-curing-type adhesive for one liquid crystal panel. Therefore, there is a problem in that the productivity becomes poor.

Moreover, the positioning accuracy of the liquid crystal panel and the glass substrate by the jig frame is about several tens of microns. Thus, there is also a limit to increasing the positioning accuracy.

SUMMARY

An advantage of the invention is that the invention provides a method of manufacturing an electro-optical device, whereby a glass substrate can be adhered to an external surface of a liquid crystal panel in a short period of time and with high positioning accuracy, and the number of manufacturing processes is significantly reduced, thus resulting in high productivity.

According to the invention, there is provided a method of manufacturing a first electro-optical device from a large substrate that is cut into a plurality of first substrates having a chip shape. The second substrates of the chip shape are bonded to the first substrates. The method includes adhering a large glass substrate to approximately an entire surface of the large substrate opposite to a surface to which the second substrates are bonded; and cutting both the large substrate and the large glass substrate into first substrate units.

In this construction, after the large glass substrate is adhered to the large substrate, which can be cut in the form of a chip and has the plurality of the first substrates, both the large substrate and the large glass substrate are cut into the first substrate units. This allows the large glass substrate to be adhered to the large substrate without the need for high positioning accuracy. Furthermore, upon cutting, the large substrate and the large glass substrate can be cut integrally. It is thus possible to obtain accurate positioning.

There is provided a method of manufacturing a second electro-optical device from a large substrate that is cut into a plurality of first substrates having a chip shape. In the device, second substrates of a chip shape are bonded to the first substrates. The method includes adhering a small glass substrate having approximately the same shape as that of the second substrates to a surface of each of the second substrates opposite to a surface to which the large substrate is bonded; and cutting the large substrate into first substrate units.

In this construction, in a state where the second substrates are respectively bonded to the first substrates of the large substrate, which can be cut in the form of a chip and has the plurality of the first substrates, the small glass substrates are individually adhered on the second substrates, and the large substrate is then cut into the first substrate units. Therefore, the small glass substrate can be adhered to the second substrate in an efficient manner.

There is provided a method of manufacturing a third electro-optical device from a large substrate that is cut into a plurality of first substrates having a chip shape. In the device, second substrates of a chip shape are bonded to the first substrates. The method includes adhering a large glass substrate to approximately the entire surface of the large substrate opposite to a surface to which the second substrates are bonded; adhering a small glass substrate having approximately the same shape as that of the second substrates to a surface of each of the second substrates opposite to a surface to which the large substrate is bonded; and cutting both the large substrate and the large glass substrate into first substrate units.

In this construction, after the large glass substrate is adhered to the large substrate, which can be cut in the form of a chip and has the plurality of the first substrates, the small glass substrate is individually adhered on the second substrate, and both the large substrate and the large glass substrate are then cut into the first substrate units. This allows the large glass substrate to be adhered to the large substrate without the need for high positioning accuracy. Furthermore, upon cutting, the large substrate and the large glass substrate can be cut in an integral manner. It is thus possible to obtain an accurate positioning. Furthermore, the small glass substrate can be adhered to the second substrate in an efficient manner.

There is provided a method of manufacturing a fourth electro-optical device from a large substrate that is cut into a plurality of first substrates having a chip shape. In the device, second substrates of a chip shape are bonded to the first substrates, respectively. The method includes adhering a small glass substrate having approximately the same shape as that of the second substrates to a surface of each of the second substrates opposite to a surface to which the large substrate is bonded; adhering a large glass substrate to approximately an entire surface of the large substrate opposite to a surface to which the second substrates are bonded; and cutting both the large substrate and the large glass substrate into first substrate units.

In this construction, after the small glass substrate is individually adhered to the plurality of the second substrates bonded to the large substrate, which can be cut in the form of a chip and has the plurality of the first substrates, the large glass substrate is adhered to the large substrate, and both the large substrate and the large glass substrate are then cut into the first substrate units. This allows the large glass substrate to be adhered to the large substrate without the need for accurate positioning. Furthermore, upon cutting, the large substrate and the large glass substrate can be cut in an integral manner. It is thus possible to obtain accurate positioning. Furthermore, the small glass substrate can be adhered to the second substrate in an efficient manner.

According to a method of manufacturing a fifth electro-optical device, in the method of manufacturing the first, third and fourth electro-optical devices, the adhering of the large glass substrate includes dropping a heat-curing-type adhesive on the large glass substrate, positioning the large substrate on the large glass substrate, and then pressing the entire large substrate toward the large glass substrate.

In this construction, after the heat-curing-type adhesive is dropped on the large glass substrate, the large substrate is disposed on the large glass substrate, and the entire large substrate is then pressed toward the large glass substrate. Therefore, the large glass substrate and the large substrate can be adhered with a high degree of adhesion.

According to a method of manufacturing a sixth electro-optical device, in the method of manufacturing the first, third and fourth electro-optical devices, the adhering of the large glass substrate includes dropping a heat-curing-type adhesive on the large glass substrate, positioning the large substrate on the large glass substrate under reduced-pressure atmosphere, pressing the entire large substrate toward the large glass substrate for a predetermined time, and after the predetermined time elapses, curing the heat-curing-type adhesive under a high-temperature atmosphere.

In this construction, the large glass substrate and the large substrate are bonded together under reduced-pressure atmosphere at a predetermined pressure. Therefore, the large glass substrate and the large substrate can be closely adhered to each other with vapor being completely removed therebetween.

According to a method of manufacturing a sixth electro-optical device, in the method of manufacturing the seventh electro-optical device, the adhering of the large glass substrate includes coating a photocuring adhesive for temporary fixing on an outer circumference of the large glass substrate, curing the photocuring adhesive by irradiation of light after the predetermined time elapses, and curing the heat-curing-type adhesive under a high-temperature atmosphere.

In this construction, before the heat-curing-type adhesive is cured under high-temperature atmosphere, the outer circumferences of the large glass substrate and the large substrate are adhered by means of the photocuring adhesive for temporary fixing. Accordingly, the large glass substrate and the large substrate can be adhered under high-temperature atmosphere in a stable manner without displacement.

According to a method of manufacturing an eighth electro-optical device, in the method of manufacturing the second, third and fourth electro-optical devices, the adhering of the small glass substrate includes positioning the large substrate on a heating unit that is heated to a predetermined temperature, dropping a heat-curing-type adhesive on the second substrate, positioning the small glass substrate on the second substrate, and pressing the small glass substrate toward the second substrate.

In this construction, the large substrate is bonded to the small glass substrate in a state in which large substrate is heated. The small glass substrate is also pressed toward the second substrate. It is thus possible to closely adhere the small glass substrate and the second substrate.

According to a method of manufacturing a ninth electro-optical device, in the method of manufacturing the second, third and fourth electro-optical devices, the adhering of the small glass substrate includes positioning the large substrate on a heating unit that is heated to a predetermined temperature, dropping a heat-curing-type adhesive on the second substrate, lowering the small glass substrate, which is held on a heating head heated to a predetermined temperature, from an upper side, positioning the small glass substrate on the second substrate, and then pressing the small glass substrate toward the second substrate for a predetermined time.

In this construction, the large substrate and the small glass substrate are bonded together in a state in that both are heated, and the small glass substrate is also pressed toward the second substrate. Therefore, since the small glass substrate and the second substrate can be adhered within a short period of time, thereby the productivity can be improved.

According to a method of manufacturing a tenth electro-optical device, in the method of manufacturing the first, third and fourth electro-optical devices, the adhering of the large glass substrate includes dropping a photocuring adhesive on the large glass substrate, positioning the large substrate on the large glass substrate, pressing the entire large substrate toward the large glass substrate, and then curing the photocuring adhesive by irradiation of light.

In this construction, the entire large substrate and the large glass substrate are bonded together using the photocuring adhesive. Accordingly, since the photocuring adhesive can be cured within a short period of time by irradiation of light, a curing time can be significantly shortened.

According to a method of manufacturing an eleventh electro-optical device, in the method of manufacturing the tenth electro-optical device, in the pressing of the entire large substrate toward the large glass substrate, at least one of the substrates is heated.

In this construction, if the photocuring adhesive is heated, the viscosity of the photocuring adhesive is reduced. Therefore, when the large substrate and the large glass substrate are pressed with the photocuring adhesive therebetween, at least one of the substrates is heated. It is thus possible to improve the diffusibility of the photocuring adhesive.

According to a method of manufacturing a twelfth electro-optical device, in the method of manufacturing the eleventh electro-optical device, the light that makes the photocuring adhesive cure is irradiated from a surface opposite to a surface of the large glass substrate to which the large substrate is bonded.

In this construction, light that cures the photocuring adhesive is irradiated from the part of the large glass substrate. Thus, in the process of manufacturing the first substrate, light is rarely blocked compared to a case where light is irradiated from the part of the large substrate where the light-shielding film, etc. is formed. It is therefore possible to cure the entire photocuring adhesive better.

According to a method of manufacturing a thirteenth electro-optical device, in the method of manufacturing the second, third and fourth electro-optical devices, the adhering of the small glass substrate includes dropping a photocuring adhesive on the second substrate, positioning the small glass substrate on the second substrate, pressing the small glass substrate toward the second substrate, and then curing the photocuring adhesive by irradiation of light.

In this construction, the second substrate and the small glass substrate are bonded together using the photocuring adhesive. Therefore, the photocuring adhesive can be cured within a short period of time by irradiating light. It is thus possible to shorten the curing time significantly.

According to a method of manufacturing a fourteenth electro-optical device, in the method of manufacturing the thirteenth electro-optical device, in the pressing of the small glass substrate toward the second substrate, at least one of the small glass substrate and the second substrate is heated.

In this construction, if the photocuring adhesive is heated, the viscosity of the photocuring adhesive is reduced. Thus, when the second substrate and the small glass substrate are pressed with the photocuring adhesive therebetween, at least one of the two substrates is heated. It is thus possible to improve the diffusibility of the photocuring adhesive.

According to a method of manufacturing a fifteenth electro-optical device, in the method of manufacturing the fourteenth electro-optical device, the light that makes the photocuring adhesive cure is irradiated from a surface opposite to a surface of the second substrate to which the small glass substrate is bonded.

In this construction, light that cures the photocuring adhesive is irradiated from the part of the second substrate. Thus, the photocuring adhesive can be cured in a state in that the small glass substrate is pressed by the heating head. This results in improved work efficiency.

BRIEF DESCRIPTION OF THE DRAWINGS

The invention will be described with reference to the accompanying drawings, wherein like numbers reference like elements, and wherein:

FIG. 6 is a table showing whether a heat-curing-type transparent adhesive has been cured on a condition basis;

DESCRIPTION OF THE EMBODIMENTS

Figure 1:
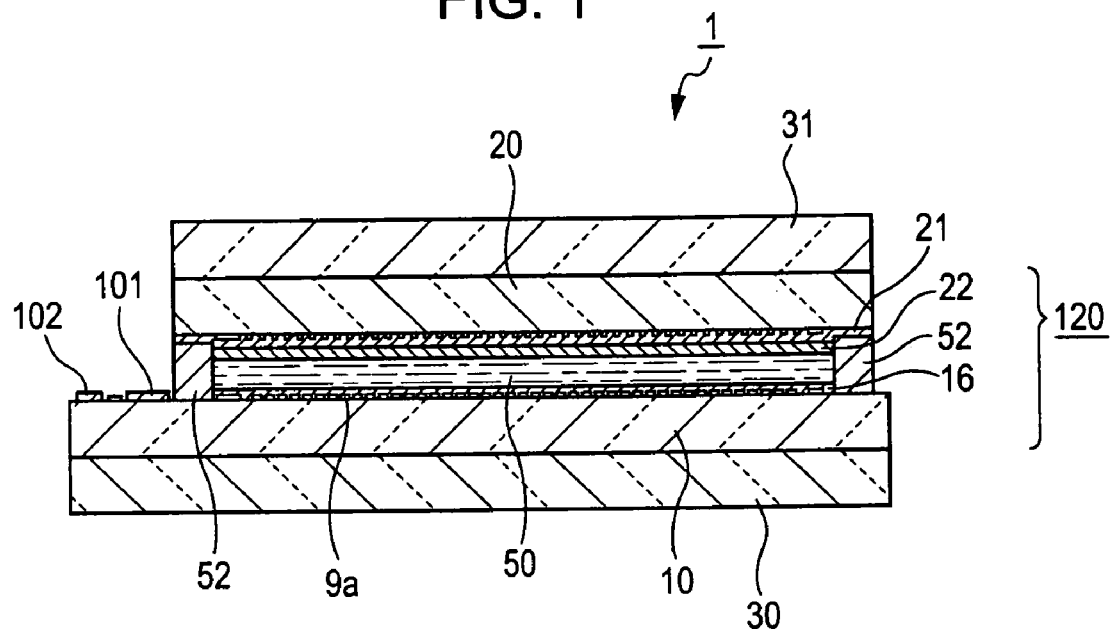
FIG. 1 is a schematic cross-sectional view of a liquid crystal display device according to a first embodiment.
Figure 2:
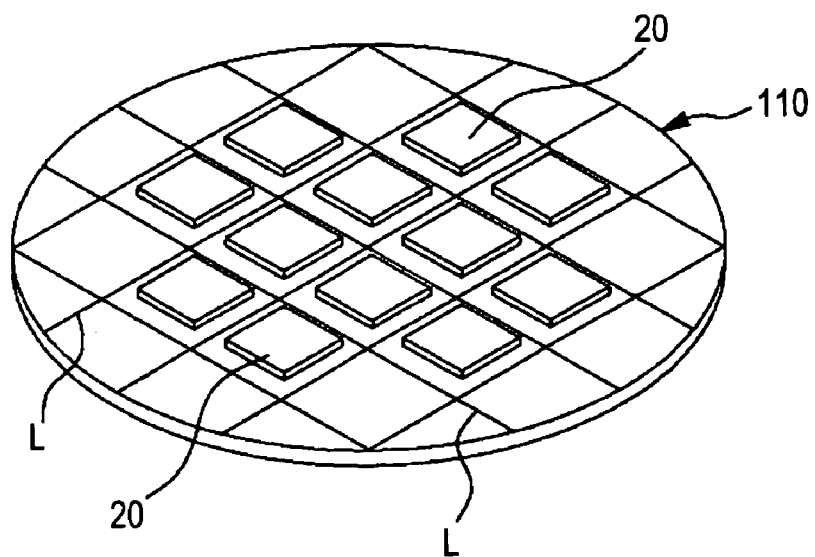
FIG. 2 is a perspective view illustrating a state where counter substrates of a chip shape are bonded to a large substrate.

An embodiment of the present invention will now be described with reference to the accompanying drawings. A first embodiment of the invention is shown in FIGS. 1 to 6. FIG. 1 is a schematic cross-sectional view of a liquid crystal display device, and FIG. 2 is a perspective view illustrating a state where chip-shaped counter substrates are bonded to a large substrate.

The overall structure of the liquid crystal display device will now be described simply with reference to FIG. 1. FIG. 1 shows a TFT-active-matrix-driven liquid crystal display device with a built-in driving circuit.

Reference numeral 1 of FIG. 1 indicates the liquid crystal display device, which is one example of an electro-optical device. The liquid crystal display device includes a liquid crystal panel 120 in which a thin-film transistor (TFT) substrate 10, serving as a first substrate, comprised of a quartz glass substrate, etc.: a counter substrate 20 serving as a second substrate, comprised of a quartz glass substrate, etc.: and liquid crystal 50 serving as an electro-optic material, which is enclosed between the opposing sides of the two substrates 10 and 20 that are bonded by the sealant 52. In the liquid crystal display device, the counter substrate is disposed opposite to the TFT substrate, are bonded together by means of a sealant 52.

Pixel electrodes (ITO) 9a that constitute pixels are disposed on the TFT substrate 10 in a matrix. A counter electrode (ITO) 21 is also disposed on the entire counter substrate 20. Furthermore, orientation films 16 and 22 on which a rubbing process is performed are formed on the entire surfaces of the pixel electrodes 9a of the TFT substrate 10 and on the entire surface of the counter substrate 20, respectively. The orientation films 16 and 22 are formed of a transparent organic film such as a polyimide film.

In addition, a data line driving circuit 101 and an external contact terminal 102 are formed on one side of the TFT substrate 10 outside a region where the sealant 52 is formed. Though not shown in the drawings, scanning line driving circuits are disposed along two sides adjacent to the one side, and a wiring pattern that connects the scanning line driving circuits is also formed on the other side.

Furthermore, transparent glass substrates (hereinafter, referred to as "dust-proof glass substrates") 30 and 31 having a dust-proof function are stuck to both sides of the liquid crystal panel 120. The dust-proof glass substrates 30 and 31 serve to prevent dust, etc. from adhering on the surface of the liquid crystal panel 120, and also separate dust, etc. from a liquid crystal display surface, to defocus it, which makes an image of the dust, etc. unnoticeable.

In order to realize this function, the dust-proof glass substrates 30 and 31 are formed to have a relatively thick substrate thickness of about 1 to 3 mm, and are formed using the same material as that of the TFT substrate 10 or the counter substrates 20. The dust-proof glass substrates 30 and 31 are also adhered to the external surfaces of the TFT substrate 10 and the counter substrates 20, respectively, with vapor being removed therefrom by using a heat-curing-type transparent adhesive consisting of a silicon-based adhesive, an acryl-based adhesive or the like, which is adjusted to have the same refractive index as that of the TFT substrate 10 or the counter substrates 20 (and the dust-proof glass substrates 30 and 31) against the surface of the liquid crystal panel 120.

The TFT substrate 10 and the counter substrate 20 are individually fabricated through different processes, and are then bonded together. As shown in FIG. 2, upon bonding, the counter substrates 20, having a chip shape, are bonded to the large substrate 110 in which a number of the TFT substrates 10 are formed. Liquid crystals are injected between the TFT substrates 10 and the counter substrates 20 and are then sealed.

Furthermore, the large substrate 110 according to the embodiment is formed to have a disk shape, but is not limited thereto. For example, the large substrate 110 can be formed to be a rectangle. In addition, although it has been shown in FIG. 2 that twelve TFT substrates 10 are formed in one large substrate 110, the number of the TFT substrates 10 formed in one large substrate 110 is not limited thereto.

The dust-proof glass substrates 30 and 31 are adhered in a state where a plurality of the liquid crystal panels 120 is formed on the large substrate 110 shown in FIG. 2. FIGS. 3A to 3D are process drawings illustrating a process of installing the dust-proof glass substrates 30 and 31 on the liquid crystal panels 120. This process is also carried out in a clean room.

Process A: after the plurality of liquid crystal panels 120 is formed on the large substrate 110 in a predetermined shape, they are washed and then undergo tests, such as an operating state test.

Process B: A large dust-proof glass substrate 300, which is almost the same size as or smaller than the large substrate 110, is adhered to an external surface (a bottom surface of FIG. 2) of the large substrate 110, which is the surface opposite to the surface to which the counter substrates 20 are bonded. The large dust-proof glass substrate 300 is also divided in the form of chips, and thus becomes the dust-proof glass substrates 30.

Process C: After the entire surface is washed, the small dust-proof glass substrates 31, which have almost the same shape as that of the counter substrates 20, are adhered to the external surfaces (top surfaces of FIG. 2) of the counter substrates 20, which are surfaces opposite to the surfaces facing the large substrate 110.

Process D: Scribe lines L are formed in the surface of the large substrate 110 to which the counter substrates 20 are bonded. The large substrate 110 is divided along the scribe lines L, and the chip-shaped liquid crystal display devices 1 are thus cut out. In this case, the large dust-proof glass substrate 300 is also cut into the chip-shaped dust-proof glass substrates 30.

Furthermore, in the process of installing the dust-proof glass substrates 30 and 31, the order of the processes B and C can be reversed. That is, before the large dust-proof glass substrate 300 is adhered to the large substrate 110, the small dust-proof glass substrates 31 can be adhered to the counter substrates 20.

Figure 3A:
FIGS. 3A to 3D are process drawings illustrating a process of installing dust-proof glass substrates on an external surface of a liquid crystal panel.
Figure 3B:
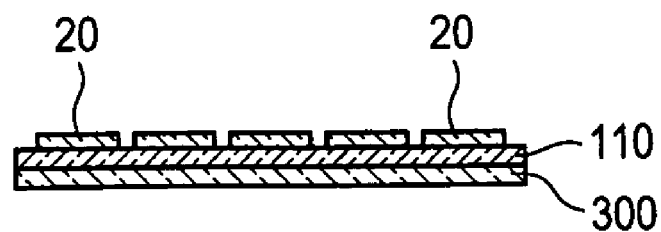

An adhesion process of the large dust-proof glass substrate 300 shown in FIG. 3B will be described below in more detail with reference to the process steps of FIG. 4.

Process A: The large dust-proof glass substrate 300 is located on a stage 40. A heat-curing-type transparent adhesive 41 includes a silicon-based adhesive, an acryl-based adhesive, etc., which is adjusted to have the same refractive index as that of the large dust-proof glass substrate 300, is dropped at the center of the large dust-proof glass substrate. An ultraviolet-curing-type adhesive 42, which is cured by irradiation of light such as ultraviolet rays, is coated near the center of the large dust-proof glass substrate 300.

Furthermore, since the ultraviolet-curing-type adhesive 42 is for temporary fixing, it need not be coated around the entire circumference of the large dust-proof glass substrate 300, but can be applied at predetermined intervals.

The large substrate 110 having the plurality of the liquid crystal panels 120 faces the large dust-proof glass substrate 300. In this state, they are transferred to a decompression chamber 130.

Process B: After the large dust-proof glass substrate 300 is put into the decompression chamber 130, the chamber is decompressed. After the decompression chamber 130 reaches a predetermined pressure (for example, about 2.5 Pa), it is left alone for a predetermined time (about 300 seconds), or until the decompression chamber 130 reaches a predetermined pressure (for example, about 1.0 Pa).

Process C: After the decompression chamber 130 reaches the state defined in the Process B, the large substrate 110 is slowly lowered onto and bonded to the large dust-proof glass substrate 300 by means of a lifting device 43, for example, at a descending rate of about 0.5 mm/sec. Furthermore, the large substrate 110 and the large dust-proof glass substrate 300 in this case have a large size and are finally cut into the liquid crystal display devices 1. It is thus not necessary to position them accurately.

The substrates are then left alone for a predetermined time (e.g., about 300 seconds). The large substrate 110 then slowly approaches the large dust-proof glass substrate 300 due to its own weight. As a result, the heat-curing-type transparent adhesive 41 dropped at the center of the large dust-proof glass substrate 300 spreads the liquid crystal panels 120 faces the large dust-proof glass substrate 300. In this state, they are transferred to a decompression chamber 130.

Process B: After the large dust-proof glass substrate 300 is put into the decompression chamber 130, the chamber is decompressed. After the decompression chamber 130 reaches a predetermined pressure (for example, about 2.5 Pa), it is left alone for a predetermined time (about 300 seconds), or until the decompression chamber 130 reaches a predetermined pressure (for example, about 1.0 Pa).

Process C: After the decompression chamber 130 reaches the state defined in the Process B, the large substrate 110 is slowly lowered onto and bonded to the large dust-proof glass substrate 300 by means of a lifting device 43, for example, at a descending rate of about 0.5 mm/sec. Furthermore, the large substrate 110 and the large dust-proof glass substrate 300 in this case have a large size and are finally cut into the liquid crystal display devices 1. It is thus not necessary to position them accurately.

The substrates are then left alone for a predetermined time (e.g., about 300 seconds). The large substrate 110 then slowly approaches the large dust-proof glass substrate 300 due to its own weight. As a result, the heat-curing-type transparent adhesive 41 dropped at the center of the large dust-proof glass substrate 300 spreads out.

Process D: In a state where a compression head 44 is in contact with the entire large substrate 110 from the top to the bottom, the large substrate 110 is pressed with predetermined pressing force (e.g., 100 g/cm$^2$) for a predetermined time (e.g., about 180 seconds). While air between the large substrate 110 and the large dust-proof glass substrate 300 is removed, the heat-curing-type transparent adhesive 41 spreads out, whereby the two substrates 110 and 300 are bonded together with a high degree of adhesion.

Process E: In the Process D, after the predetermined time elapses (e.g., about 180 seconds), the decompression chamber 130 is slowly pressurized until it reaches atmospheric pressure, and the two bonded substrates 110 and 300 are then taken out from the decompression chamber 130. Thereafter, the ultraviolet-curing-type adhesive 42 coated around the large dust-proof glass substrate 300 is irradiated with ultraviolet rays 45 and is then cured. The ultraviolet-curing-type adhesive 42 temporarily fixes the two substrates 110 and 300.

Process F: The two substrates 110 and 300, which are temporarily fixed by the ultraviolet-curing-type adhesive 42, are transferred to a high-temperature chamber 131 that is heated to a predetermined temperature (e.g., about 80° C.). In the high-temperature chamber, the substrates 110 and 300 are left alone for a predetermined time (e.g., about 1.5 hours) to cure the heat-curing-type transparent adhesive 41 and bond the substrates 110 and 300 together. In this case, the large substrate 110 and the large dust-proof glass substrate 300 are bonded together in a stable manner without displacement because they are temporarily fixed by the ultraviolet-curing-type adhesive 42.

After the predetermined time (for example, about 1.5 hours), the two substrates 110 and 300 are taken out from the high-temperature chamber 131, and are then cooled down to a predetermined temperature. Thereby, the bonding of the large dust-proof glass substrate 300 is completed.

Although the curing time of the ultraviolet-curing-type adhesive is set to be relatively long, the total curing time can be significantly reduced compared to when the substrates 110 and 300 are individually cured because both the entire substrates 110 and 300 can be bonded simultaneously. It is thus possible to improve productivity to that extent.

Figure 3C:
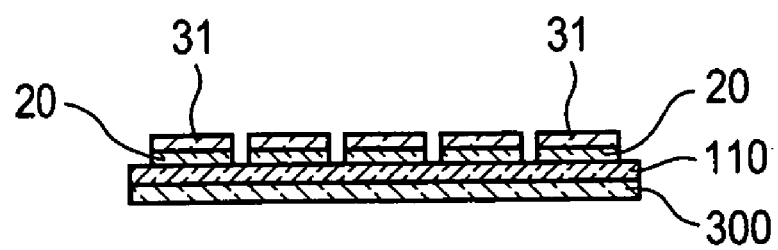
Figure 3D:
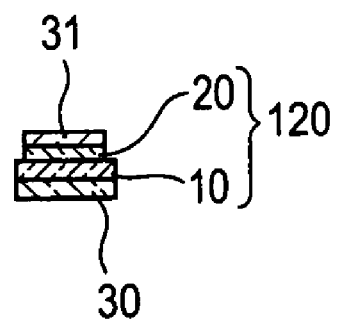
Figure 4A:
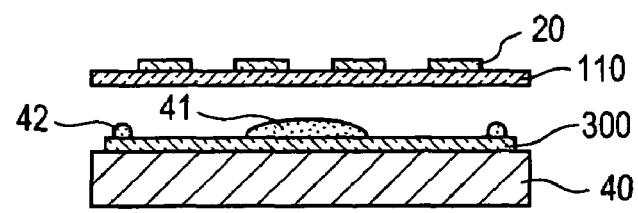
FIGS. 4A to 4F are process drawings illustrating an adhesion process of a large dust-proof glass substrate.
Figure 4B:
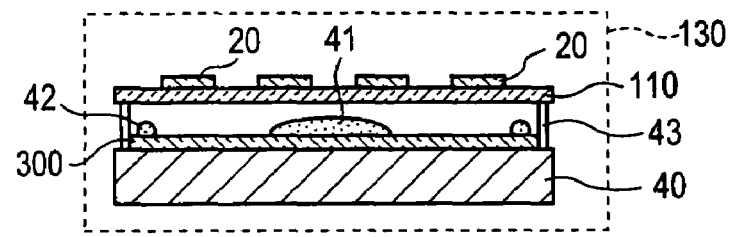
Figure 4C:
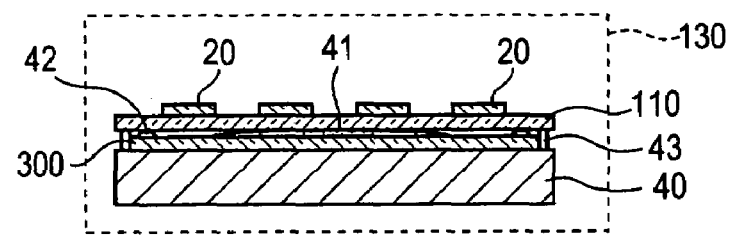
Figure 4D:
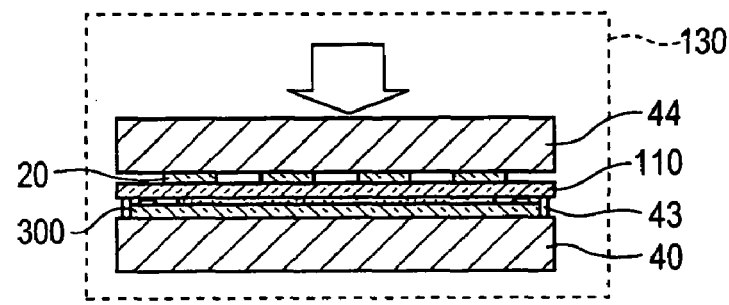
Figure 4E:
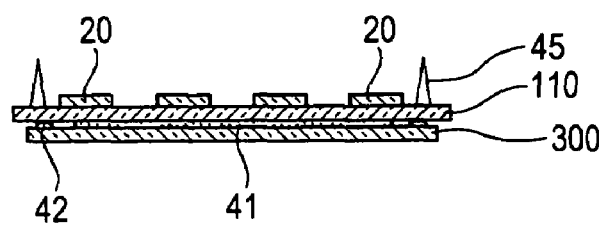
Figure 4F:
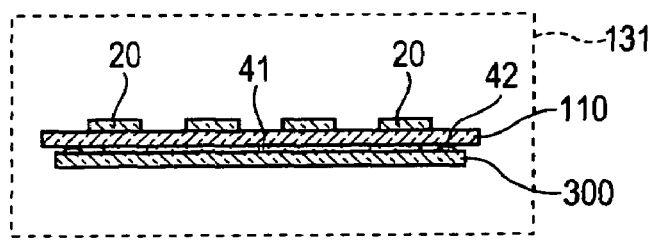
Figure 5A:
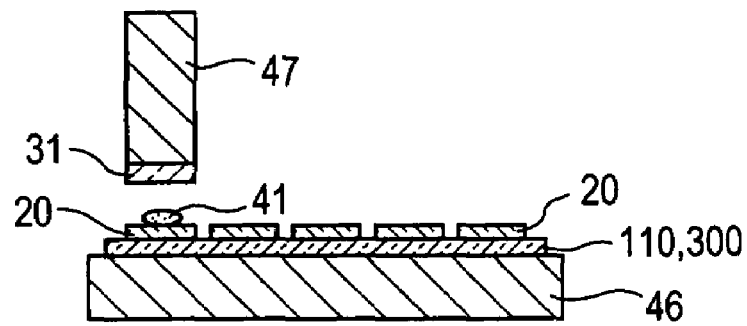
FIGS. 5A to 5C are process drawings illustrating an adhesion process of a small dust-proof glass substrate.
Figure 5B:
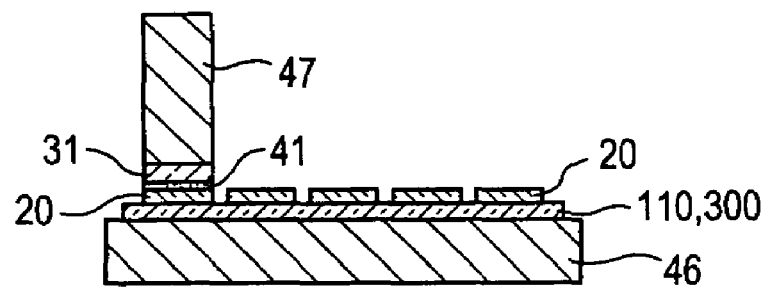
Figure 5C:
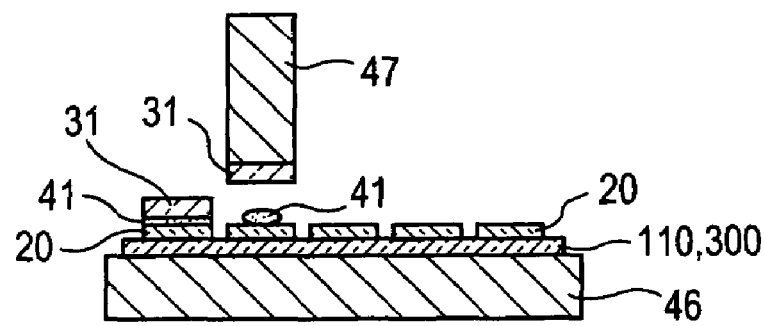

Hereinafter, a process of adhering the dust-proof glass substrate 31 (hereinafter, referred to as "small dust-proof glass substrate") shown in FIG. 3C will be described in more detail with reference to process steps in FIG. 5. In this case, the small dust-proof glass substrate 31 is bonded under atmospheric pressure.

Process A: The large substrate 110 to which the large dust-proof glass substrate 300 is bonded is disposed on a hot plate 46 that is a heating unit, which is heated to a predetermined temperature (e.g., about 70 to 80° C.). The heat-curing-type transparent adhesive 41 is then dropped at the center of the top surface of one of the counter substrates 20. The hot plate 46 is also disposed on a stage (not shown).

Meanwhile, a heating head 47 is disposed over the counter substrates 20 so that they face each other. The heating head 47 and the hot plate 46 on which the large substrate 110 is positioned are movable relative to each other, and are disposed opposite to each other while positioned at predetermined locations.

The small dust-proof glass substrate 31 is held by suction on the bottom surface of the heating head 47. A heater is disposed at the bottom of the heating head 47, and a suction hole is also formed therein. A suction pump (not shown) is communicated with the suction hole. The small dust-proof glass substrate 31 is held by suction on the bottom surface of the heating head 47 by the suction force of the suction pump, and is also heated by the heater to a temperature of about 85 to 100° C.

Process B: The heating head 47 is lowered, and the small dust-proof glass substrates 31 that is held by suction on the bottom surface of the heating head 47 is then brought in contact with the surface of the counter substrates 20. They are then pressed together with a predetermined compression force (e.g., about 0.15 Kg/cm$^2$) for a predetermined time (e.g., about 10 to 20 seconds). The small dust-proof glass substrate 31 is thus press bonded against the counter substrate 20.

Thus, while the heat-curing-type transparent adhesive 41 spreads out, it is heated and cured by means of the large substrate 110, which is being heated by the hot plate 46 to a temperature of about 70 to 80° C., and the small dust-proof glass substrate 31, which is being heated by the heater to a temperature of about 85 to 100° C.

Moreover, the curing time of the heat-curing-type transparent adhesive 41 can be determined according to the heating temperature of the heating head 47 of the small dust-proof glass substrate 31, and the heating temperature of the hot plate 46 of the large substrate 110. The pressure bonding time of the heating head 47 can be set according to the curing time of the heat-curing-type transparent adhesive 41.

As shown in FIG. 6, in a state where the compression force of the heating head 47 was set to be constant, whether the heat-curing-type transparent adhesive 41 was cured or not cured was examined while changing the conditions, such as the heating temperature of the heating head 47, the heating temperature of the hot plate 46, and the pressure bonding time of the heating head 47, in various ways. The experiment showed that under condition 6, the heat-curing-type transparent adhesive 41 cured more efficiently within the shortest amount of time.

Process C: After the pressure bonding time of the small dust-proof glass substrate 31 by the heating head 47 reaches a predetermined pressure bonding time, i.e., after the heat-curing-type transparent adhesive 41 is cured, the heating head 47 is raised. Since the small dust-proof glass substrate 31 is bonded to the counter substrate 20 by means of the heat-curing-type transparent adhesive 41, it is separated from the bottom surface of the heating head 47, thereby completing the bonding of the small dust-proof glass substrate 31.

Thereafter, the stage (not shown) on which the hot plate 46 is located and the heating head 47 are movable relative to each other, such that the heating head 47 is disposed on a neighboring counter substrate 20 to face it. In this state, the small dust-proof glass substrate 31 is adhered to the neighboring counter substrate 20 by repeating the same processes as the processes A to C. By repeating these processes on the remaining counter substrates 20, the other small dust-proof glass substrates 31 are adhered to the external surfaces of all the counter substrates 20 bonded to the large substrate 110.

As such, according to the embodiment, the process of adhering the dust-proof glass substrates 300 and 31 to the external surface of the liquid crystal panel 120 is carried out before the process of cutting out the liquid crystal panels 120 from the large substrate 110 in the form of a chip. It is thus possible to significantly reduce the number of adhesion processes by attaching only one large dust-proof glass substrate 300 to the external surface of the large substrate 110. Further, the large dust-proof glass substrate 300 is simultaneously cut out with the large substrate 110, and thus becomes the dust-proof glass substrates 30 to protect the external surfaces of the TFT substrates 10. This eliminates the need for accurate positioning when the large dust-proof glass substrate 300 is adhered to the large substrate 110, and thus improves work efficiency.

Meanwhile, the process in which the small dust-proof glass substrates 31 are adhered to the external surfaces of the counter substrates 20 is performed in a state where the large substrate 110 is heated by the hot plate 46, the small dust-proof glass substrates 31 are heated by the heating head 47, and the small dust-proof glass substrates 31 are adhered by compression force being applied thereto. It is thus possible to shorten the curing time of the heat-curing-type transparent adhesive 41. This leads to a reduction of the time needed for one adhesion process, which significant reduces the working hour and improves the productivity. The small dust-proof glass substrates 31 are also adhered one-by-one while being positioned at predetermined locations on the tops of the counter substrates 20. This allows for positioning with high accuracy.

Further, the dust-proof glass substrates 30 and 31 can be adhered to the external surfaces of the liquid crystal panel 120 without using a jig frame. This eliminates the processes for assembly, dismantling, etc. of the jig frame, and can thus significantly reduce the number of working processes.

Figure 7A:
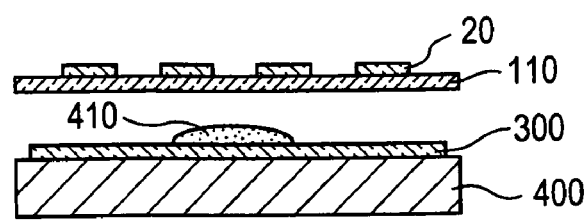
FIGS. 7A to 7E are process drawings illustrating an adhesion process of a large dust-proof glass substrate according to a second embodiment.
Figure 7B:
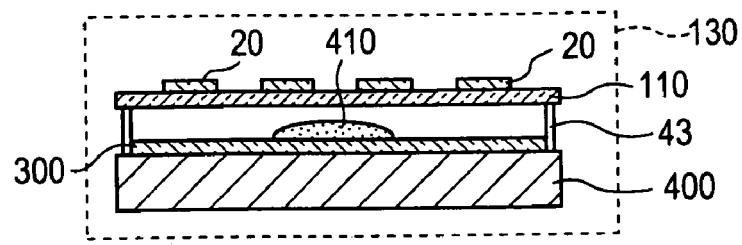
Figure 7C:
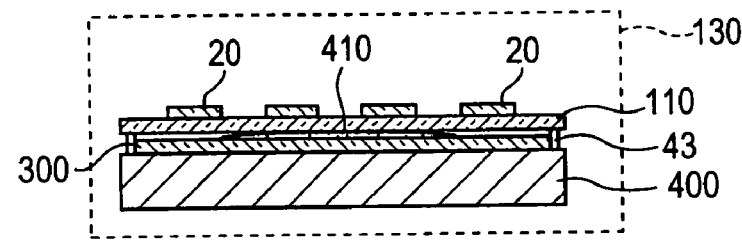
Figure 7D:
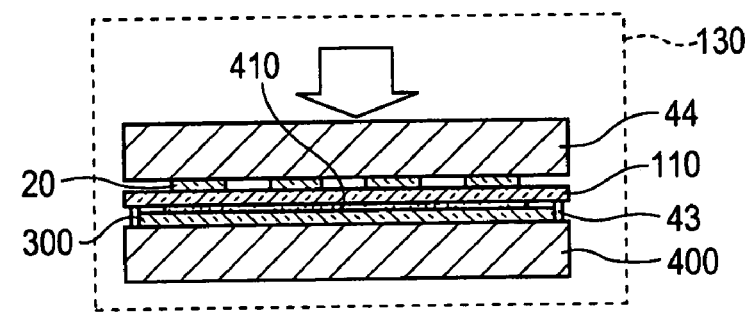
Figure 7E:
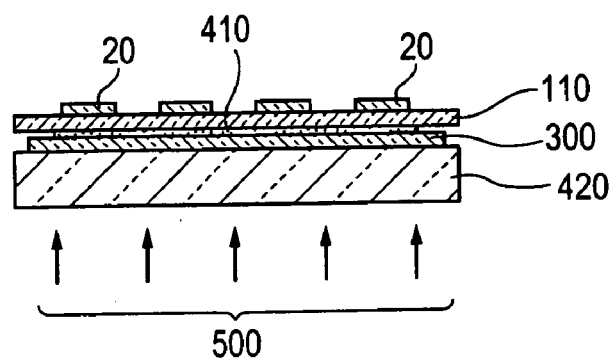
Figure 8A:
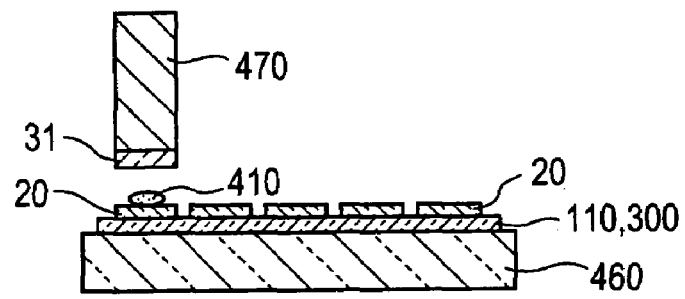
FIGS. 8A to 8C are process drawings illustrating an adhesion process of a small dust-proof glass substrate.
Figure 8B:
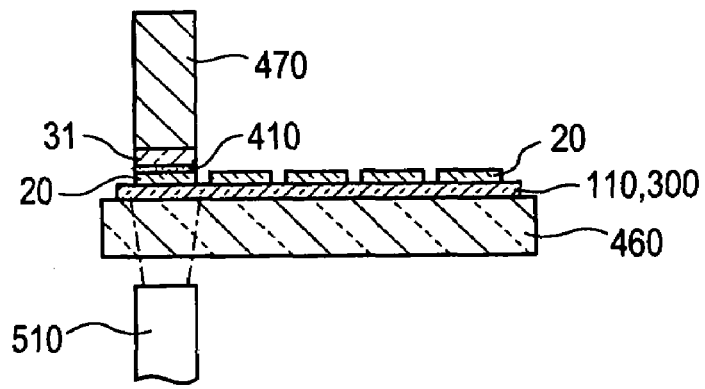
Figure 8C:
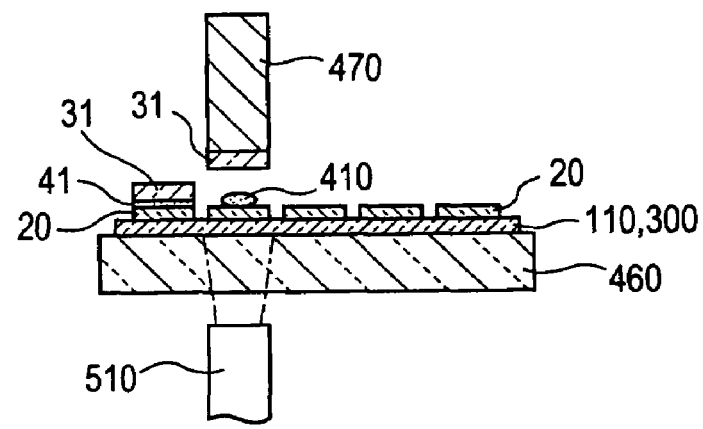

FIGS. 7 and 8 illustrate a second embodiment of the invention. It has been described in the above first embodiment that the large dust-proof glass substrate 300 and the small dust-proof glass substrates 31 are adhered to the large substrate 110 and the counter substrates 20, respectively, by means of the heat-curing-type transparent adhesive 41. In the second embodiment, however, the large dust-proof glass substrate 300 and the small dust-proof glass substrates 31 are adhered using a photocuring (visible ray or ultraviolet) type transparent adhesive.

In other words, in the second embodiment, in the process of adhering the large dust-proof glass substrate 300, the process shown in FIG. 7 is adopted instead of the process shown in FIG. 4 according to the first embodiment.

Process A: A large dust-proof glass substrate 300 is located on a hot plate 400 as the heating unit which is heated to a predetermined temperature (for example, about 40 to 50° C. A photocuring (visible ray or ultraviolet) type transparent adhesive 410 includes of a silicon-based adhesive, an acryl-based adhesive, or the like, which is adjusted to have the same refractive index as that of the large dust-proof glass substrate 300, is dropped at the center of the large dust-proof glass substrate. The transparent photocuring adhesive 410 has the property in which the viscosity is reduced while being heated. Accordingly, the viscosity of the transparent photocuring adhesive 410 dropped on the large dust-proof glass substrate 300 is reduced, which is being heated to a predetermined temperature by means of the hot plate 400, therefore the diffusibility is improved.

The large substrate 110 having a plurality of the liquid crystal panels 120 formed on is then disposed on the large dust-proof glass substrate 300 in the opposite manner. In this state, they are transferred to a decompression chamber 130.

Process B: After the large dust-proof glass substrate 300 is brought into the decompression chamber 130, the chamber is decompressed. After the decompression chamber reaches the predetermined pressure (for example, about 2.5 Pa), it is left alone for the predetermined time (about 300 seconds), or until the decompression chamber 130 reaches about the predetermined pressure (for example, about 1.0 Pa).

Process C: After the decompression chamber 130 reaches the state set in the Process B, the large substrate 110 is slowly lowered onto and bonded to the large dust-proof glass substrate 300 by means of a lifting device 43, for example, at a descending rate of about 0.5 mm/sec. Furthermore, the large substrate 110 and the large dust-proof glass substrate 300 in this case have a large size and are finally cut into the liquid crystal display devices 1. It is thus not necessary to position them accurately.

They are then left alone for the predetermined time (e.g., about 300 seconds). The large substrate 110 then slowly nears the large dust-proof glass substrate 300 due to its own weight. As a result, the transparent photocuring adhesive 410 dropped at the center of the large dust-proof glass substrate 300 spreads out. Thus, as the viscosity of the transparent photocuring adhesive 410 is reduced due to the heat of the large dust-proof glass substrate 300, which is being heated by the hot plate 400, improved diffusibility can be obtained.

Process D: In a state where a compression head 44 is in contact with the entire large substrate 110 from the top to the bottom, the large substrate 110 is uniformly pressed with predetermined pressing force (e.g., 100 g/cm$^2$) only for a predetermined time (e.g., about 180 seconds). While the air between the large substrate 110 and the large dust-proof glass substrate 300 is removed, the transparent photocuring adhesive 410 spreads out, whereby the two substrates 110 and 300 are bonded together with a high degree of adhesion.

Process E: In the Process D, after the predetermined time (e.g., about 180 seconds) elapses, the decompression chamber 130 is slowly pressurized up to reach atmospheric pressure. The two substrates 110 and 300 that are bonded together are taken out of the decompression chamber 130, and are then positioned on a transparent stage 420 through which light can transmit. Thereafter, the transparent photocuring adhesive 410 interposed between the large dust-proof glass substrate 300 and the large substrate 110 is irradiated with a photo irradiator 500 from the bottom, so that the transparent photocuring adhesive 410 is cured. The bonding of the large dust-proof glass substrate 300 to the large substrate 110 is thereby completed.

Furthermore, in the case where an ultraviolet-curing-type transparent adhesive is used as the transparent photocuring adhesive 410, light irradiated from the photo irradiator 500 is an ultraviolet ray. In the case where a visible ray curing type transparent adhesive is used, light irradiated from the photo irradiator 500 can be a visible ray having a wavelength region of 410 nm or more.

In the event that the photocuring (ultraviolet curing) type transparent adhesive 410, which is cured with a dose of light irradiation of about 3000 mJ/cm$^2$, is adopted, an irradiation time can be improved to about 6 seconds, when the output is, e.g., 500 W. The irradiation time can be freely set according to the output. It is therefore possible to significantly reduce the curing time, compared to the first embodiment in which the heat-curing-type transparent adhesive 41 is used. The productivity can be thus improved to that extent. In addition, since the transparent photocuring adhesive 410 can be cured instantly, it is not necessary to temporarily fix the surroundings of the large dust-proof glass substrate 300 using the ultraviolet-curing-type adhesive as in the first embodiment. This allows the manufacturing process to be simplified to that extent.

When the transparent photocuring adhesive 410 is cured, light can be irradiated from the part of the counter substrates 20, i.e., the top of FIG. 7E. As the light-shielding film dividing a display region is formed on an inner surface of the counter substrates 20, light irradiated from the top is likely to be shielded by the light-shielding film. Thus, light is preferably irradiated from the part of the large dust-proof glass substrate 300 where light is rarely blocked.

An adhesion process of the small dust-proof glass substrate 31 will now be described. In the adhesion process of the small dust-proof glass substrates 31 according to the second embodiment, the process shown in FIG. 8 is adopted instead of the process shown in FIG. 5 according to the first embodiment. The small dust-proof glass substrate 31 is also adhered under atmospheric pressure.

Process A: A large substrate 110 to which a large dust-proof glass substrate 300 is adhered is positioned on a transparent plate (hereinafter, referred to as a "light transmission plate") 460 through which light can pass. A transparent photocuring adhesive 410 is then dropped at the center of a top surface of one counter substrate 20.

Meanwhile, a heating head 470 is disposed over the counter substrate 20 in the opposite manner. The heating head 470 and the light transmission plate 460 on which the large substrate 110 is positioned are movable relative to each other and are disposed opposite to each other while being positioned at predetermined locations.

The small dust-proof glass substrate 31 is held by suction on the bottom surface of the heating head 470. The construction of the heating head 470 is the same as that of the heating head 47 according to the first embodiment. The small dust-proof glass substrate 31 is held by suction on the bottom surface of the heating head 470 by the suction force of a suction pump, and is also being heated by a heater at a temperature of about 40 to 50° C.

Process B: The heating head 470 is lowered, and the small dust-proof glass substrates 31 that is held by suction on the bottom surface of the heating head 470 is then evenly brought in contact with the surface of the counter substrate 20. The small dust-proof glass substrate 31 is then compressed against the counter substrate 20 with a predetermined compression force (for example, about 0.15 Kg/cm$^2$) for a predetermined time (for example, about 10 to 20 seconds). Since the counter substrate 20 is heated by the heating head 470 at a temperature of about 40 to 50° C., if the counter substrate 20 is brought in contact with the transparent photocuring adhesive 410, the transparent photocuring adhesive 410 is heated. Therefore, the viscosity of the transparent photocuring adhesive 410 is reduced, and the transparent photocuring adhesive 410 advantageously spreads out.

Further, after the transparent photocuring adhesive 410 is uniformly spread between the counter substrates 20 and the small dust-proof glass substrate 31, the transparent photocuring adhesive 410 interposed between the counter substrates 20 and the small dust-proof glass substrate 31 is irradiated with light from an optical fiber 510 disposed under the light transmission plate 460. Even in this case, in the case where an ultraviolet-curing-type transparent adhesive is used as the transparent photocuring adhesive 410, and is cured with a dose of light irradiation of about 3000 mJ/cm$^2$ as described above, the irradiation time can be improved to about 6 seconds when the output is, e.g., 500 W.

Therefore, even in this case, a curing time can be significantly reduced compared to the first embodiment in which the heat-curing-type transparent adhesive 41 is used. The productivity can be thus improved to that extent.

Process C: After the transparent photocuring adhesive 410 is cured, the heating head 470 is raised. Since the small dust-proof glass substrate 31 is bonded to the counter substrate 20 by means of the transparent photocuring adhesive 410, it is separated from the bottom surface of the heating head 470. The bonding of the small dust-proof glass substrate 31 is thus completed.

Thereafter, while the light transmission plate 460 and the heating head 470 are relatively moved to each other, the heating head 470 is disposed over another counter substrate 20 adjacent to the one counter substrate in an opposite manner. In this state, the small dust-proof glass substrate 31 is adhered to the other counter substrate 20 by repeating the same processes as the processes A to C. By repeating these processes on the remaining counter substrates 20, the small dust-proof glass substrates 31 are adhered to the external surfaces of all the counter substrates 20 bonded to the large substrate 110.

In this case, each of the counter substrates 20 has been irradiated with light by means of the optical fiber 510, but the entire large substrate 110 can be irradiated with light by means of a photo irradiator (not shown).

As such, according to the second embodiment, when the dust-proof glass substrates 300 and 31 are adhered to the external surfaces of the liquid crystal panel 120, the transparent photocuring adhesive 410 is used as an adhesive. It is thus possible to significantly reduce the curing time and also to improve the productivity to that extent.

Furthermore, the transparent photocuring adhesive 410 is spread between the dust-proof glass substrates 300 and 31, and the substrates 110 and 20 with its viscosity

What is claimed is:

1. A method of manufacturing a plurality of electro-optical devices including transparent first and second chips adhered together, the method comprising:

preparing a plurality of the second chips in the size of the second chips in the manufactured electro-optical devices;

after preparing the plurality of second chips, adhering the plurality of second chips individually to a plurality of separate positions on a large substrate;

adhering a large dust-proof substrate to approximately an entire surface of the large substrate opposite to a surface to which the second chips are bonded using a layer of adhesive covering approximately the entire surface of the large substrate; and cutting both the large substrate and the large dust-proof substrate into first chip units.

2. A method of manufacturing a plurality of electro-optical devices including first and second chips adhered together, the method comprising:

preparing a plurality of the second chips in the size of the second chips in the manufactured electro-optical devices;

after preparing the plurality of second chips, adhering the plurality of second chips individually to a plurality of separate positions on a large substrate;

disposing the large substrate on a hot plate that is heated to a predetermined temperature;

after disposing the large substrate on the hot plate, dropping an adhesive onto a surface of each of the second chips opposite to a surface to which the large substrate is bonded;

after dropping the adhesive on each of the second chips, adhering a small substrate having approximately the same shape as that of the second chips to the surface of each of the second chips opposite to a surface to which the large substrate is bonded; and cutting the large substrate into first chip units.

3. A method of manufacturing a plurality of electro-optical devices including first and second chips adhered together, the method comprising:

preparing a plurality of the second chips in the size of the second chips in the manufactured electro-optical devices;

after preparing the plurality of second chips, adhering the plurality of second chips individually to a plurality of separate positions on a first large substrate;

adhering a second large substrate to approximately the entire surface of the first large substrate opposite to a surface to which the second chips are bonded;

adhering a small substrate having approximately the same shape as that of the second chips to a surface of each of the second chips opposite to a surface to which the first large substrate is bonded; and cutting both the first large substrate and the second large substrate into first chip units.

4. A method of manufacturing a plurality of electro-optical devices including first and second chips adhered together, the method comprising:

preparing a plurality of the second chips in the size of the second chips in the manufactured electro-optical devices;

after preparing the plurality of second chips, adhering the plurality of second chips individually to a plurality of separate positions on a first large substrate;

adhering a small substrate having approximately the same shape as that of the second chips to a surface of each of the second chips opposite to a surface to which the first large substrate is bonded;

adhering a second large substrate to approximately an entire surface of the first large substrate opposite to a surface to which the second chips are bonded; and cutting both the first large substrate and the second large substrate into first chip units.

5. The method according to claim 1, wherein the adhering of the large dust-proof substrate includes dropping a heat-curing-type adhesive on the large dust-proof substrate, positioning the large substrate on the large dust-proof substrate, and then pressing the entire large substrate toward the large dust-proof substrate.

6. The method according to claim 1, wherein the adhering of the large dust-proof substrate includes dropping a heat-curing-type adhesive on the large dust-proof substrate, positioning the large substrate on the large dust-proof substrate under reduced-pressure atmosphere, pressing the entire large substrate toward the large dust-proof substrate for a predetermined time, and after the predetermined time elapses, curing the heat-curing-type adhesive under a high-temperature atmosphere.

7. The method according to claim 6, wherein the adhering of the large dust-proof substrate includes coating a photocuring adhesive for temporary fixing on an outer circumference of the large dust-proof substrate, curing the photocuring adhesive by irradiation of light after the predetermined time elapses, and curing the heat-curing-type adhesive under a high-temperature atmosphere.

8. The method according to claim 2, wherein the adhering of the small substrate includes positioning the large substrate on the hot plate that is heated to a predetermined temperature, dropping a heat-curing-type adhesive on the second chip, positioning the small substrate on the second chip, and pressing the small substrate toward the second chip.

9. The method according to claim 2, wherein the adhering of the small substrate includes positioning the large substrate on the hot plate that is heated to a predetermined temperature, dropping a heat-curing-type adhesive on the second chip, lowering the small substrate, which is held on a heating head heated to a predetermined temperature, from an upper side, positioning the small substrate on the second chip, and then pressing the small substrate toward the second chip for a predetermined time.

10. The method according to claim 1, wherein the adhering of the large dust-proof substrate, includes dropping a photocuring adhesive on the large dust-proof substrate, positioning the large substrate on the large dust-proof substrate, pressing the entire large substrate toward the large dust-proof substrate, and then curing the photocuring adhesive by irradiation of light.

11. The method according to claim 10, wherein in the pressing of the entire large substrate toward the large dust-proof substrate, at least one of the substrates is heated.

12. The method according to claim 11, wherein the light that makes the photocuring adhesive cure is irradiated from a surface of the large dust-proof substrate, opposite to a surface to which the large substrate is bonded.

13. The method according to claim 2, wherein the adhering of the small substrate includes dropping a photocuring adhesive on the second chip, positioning the small substrate on the second chip, pressing the small substrate toward the second chip, and then curing the photocuring adhesive by irradiation of light.

14. The method according to claim 13, wherein in the pressing of the small substrate toward the second chip, at least one of the small substrate and the second chip is heated.

15. The method according to claim 14, wherein the light that makes the photocuring adhesive cure is irradiated from a surface of the second chip opposite to a surface to which the small substrate is bonded.

* * * * *